US009270249B2

United States Patent
Yen et al.

(10) Patent No.: US 9,270,249 B2
(45) Date of Patent: Feb. 23, 2016

(54) TUNABLE IMPEDANCE MATCHING CIRCUIT

(75) Inventors: Yu-Meng Yen, Taoyuan County (TW);
Chen-Fang Tai, Taoyuan County (TW);
Pei-Zong Rao, Taoyuan County (TW);
Wei-Shin Tung, Taoyuan County (TW);
Wan-Ming Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 299 days.

(21) Appl. No.: 13/590,178

(22) Filed: Aug. 20, 2012

(65) Prior Publication Data

US 2014/0049442 A1 Feb. 20, 2014

(51) Int. Cl.
*H01Q 1/50* (2006.01)
*H03H 7/40* (2006.01)
*H04B 1/04* (2006.01)

(52) U.S. Cl.
CPC ............. *H03H 7/40* (2013.01); *H04B 1/0458* (2013.01)

(58) Field of Classification Search
CPC ........................................................ H01Q 1/50
USPC ........................................................ 343/861
See application file for complete search history.

(56) References Cited

U.S. PATENT DOCUMENTS 5,412,310 A * 5/1995 Wolk et al. .................... 323/355
5,872,489 A 2/1999 Chang et al.
6,130,589 A 10/2000 Yamaguchi et al.
2007/0046369 A1* 3/2007 Schober et al. ................... 330/7
2008/0252549 A1* 10/2008 Ohtaki et al. ................. 343/861
2008/0305749 A1 12/2008 Ben-Bassat

FOREIGN PATENT DOCUMENTS

| CN | 1277754 | 12/2000 |
|----|---------|---------|
| CN | 101438459 | 5/2009 |
| TW | 201210190 | 3/2012 |
| TW | 201214958 | 4/2012 |

OTHER PUBLICATIONS

"Office Action of Taiwan Counterpart Application", issued on Oct. 23, 2014, p. 1-p. 7.
"Office Action of China Counterpart Application", issued on Jan. 23, 2015, p. 1-p. 5.

* cited by examiner

*Primary Examiner* — Dameon E Levi
*Assistant Examiner* — Andrea Lindgren Baltzell
(74) *Attorney, Agent, or Firm* — Jianq Chyun IP Office

(57) ABSTRACT

A tunable impedance matching circuit is provided for matching a signal source to an impedance of an antenna. The tunable impedance matching circuit includes two terminals, a series path, and two shunt paths. The first terminal is coupled to the signal source, and the second terminal is coupled to the antenna. The series path is coupled between the first terminal and the second terminal and includes a first tunable capacitor and at least one tunable inductor. One of the two shunt paths is coupled between the first terminal and a ground end, and the other one of the two shunt paths is coupled between the second terminal and the ground end. Each of the shunt paths includes a second tunable capacitor.

9 Claims, 5 Drawing Sheets

TUNABLE IMPEDANCE MATCHING CIRCUIT

BACKGROUND OF THE INVENTION

1. Field of the Invention

The invention relates to a tunable impedance matching circuit and particularly relates to a tunable impedance matching circuit having a tunable inductor.

2. Description of Related Art

Impedance matching is important for electronic devices that emit wireless signals, such as mobile phones. If an RF (radio frequency) signal encounters unmatched impedance when being transmitted from a power amplifier to an antenna, a portion of the signal energy will be reflected by the antenna, and consequently the signal energy output by the power amplifier cannot be completely emitted by the antenna. Therefore, impedance matching is an important issue in the field of wireless communication.

A mobile phone usually includes an impedance matching circuit for matching the impedance of the antenna, so that the energy emitted from the power amplifier can be completely transmitted to the antenna to achieve the best transmission efficiency. The impedance of the antenna may vary when affected by nearby objects. Moreover, now most mobile phones support multi-band communication. Take GSM (Global System for Mobile Communications) as an example, GSM 900, GSM 1800, and GSM 1900 use different frequency bands, and for this reason, mobile phones that support the foregoing need to perform impedance matching in different frequency bands. These factors increase the complexity of impedance matching, and fixed impedance matching circuits can no longer satisfy the demands. Tunable impedance matching circuits provide wider matching ranges and thus are suitable for complicated application that requires multiple frequency bands.

FIG. 1 is a schematic diagram of a conventional tunable impedance matching circuit 100, wherein a voltage source 102 supplies a DC bias voltage, and a signal source 101 provides an RF signal to an antenna 103, which emits the RF signal. A tunable capacitor 104 changes a capacitance thereof according to a control signal, thereby changing the impedance encountered by the RF signal, so as to match the impedance of the antenna 103. In the tunable impedance matching circuit 100, only the series path has tunable impedance, and the impedance of the shunt path is fixed. Therefore, the tunable impedance matching circuit 100 has a smaller matching range, which may not be sufficient.

FIG. 2 is a schematic diagram of another conventional tunable impedance matching circuit 200. The series path of the tunable impedance matching circuit 200 includes a tunable capacitor 202, and the shunt path thereof includes tunable capacitors 201 and 203. In the tunable impedance matching circuit 200, both the series path and the shunt path have tunable impedances, which provides a wider matching range. However, in order to widen the matching range, the tunable capacitor 202 in this type of impedance matching circuit is usually designed to have a wider impedance-tunable range, e.g. from 0.7 pF to 7 pF, that is, a tunable impedance range of 1:10. The capacitor with the wider tunable range will increase consumption of the RF signal and impair the over-the-air performance of the antenna.

SUMMARY OF THE INVENTION

The invention provides a tunable impedance matching circuit that has a wide matching range and does not affect the over-the-air performance of an antenna.

The invention provides a tunable impedance matching circuit adapted for matching a signal source to an impedance of an antenna. The tunable impedance matching circuit includes two terminals, a series path, and two shunt paths. A first terminal is coupled to the signal source, and a second terminal is coupled to the antenna. The series path is coupled between the first terminal and the second terminal and includes a first tunable capacitor and at least one tunable inductor. One of the two shunt paths is coupled between the first terminal and a ground end, and the other of the two shunt paths is coupled between the second terminal and the ground end. Each of the shunt paths includes a second tunable capacitor.

In an embodiment of the invention, the first tunable capacitor and the tunable inductor are connected in series between the first terminal and the second terminal.

In an embodiment of the invention, the second tunable capacitor is coupled to the first terminal or the second terminal, and each of the shunt paths further includes a capacitor and a diode. The capacitor is coupled between the second tunable capacitor and the ground end. An anode of the diode is coupled to the second tunable capacitor and the capacitor and receives a control signal. A cathode of the diode is coupled to the ground end.

In an embodiment of the invention, when the signal source sends a first RF signal to the antenna, the control signal turns on the diode; and when the signal source sends a second RF signal to the antenna, the control signal turns off the diode. A frequency of the first RF signal is lower than a frequency of the second RF signal.

Based on the above, the invention uses the tunable capacitor with a smaller impedance-tunable range and utilizes a special circuit design to compensate for the smaller range, so as to satisfy the requirements for the impedance matching range and the over-the-air performance of the antenna.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 3:
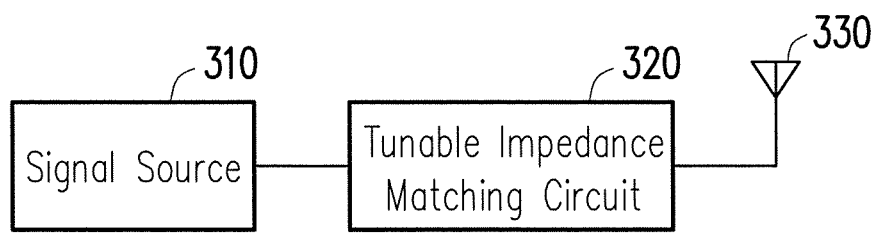
FIG. 3 and FIG. 4 are schematic diagrams of a tunable impedance matching circuit according to an embodiment of the invention.

FIG. 3 is a schematic diagram of a tunable impedance matching circuit 320 according to an embodiment of the invention. The circuit of FIG. 3 may be a mobile phone or other electronic devices that can emit wireless signals, and a signal source 310 may be a power amplifier or other circuits that can provide RF signals. The signal source 310 outputs an RF signal for an antenna 330 to emit, and the tunable impedance matching circuit 320 is coupled between the signal source 310 and the antenna 330 for matching the signal source 310 with the impedance of the antenna 330.

Figure 4:
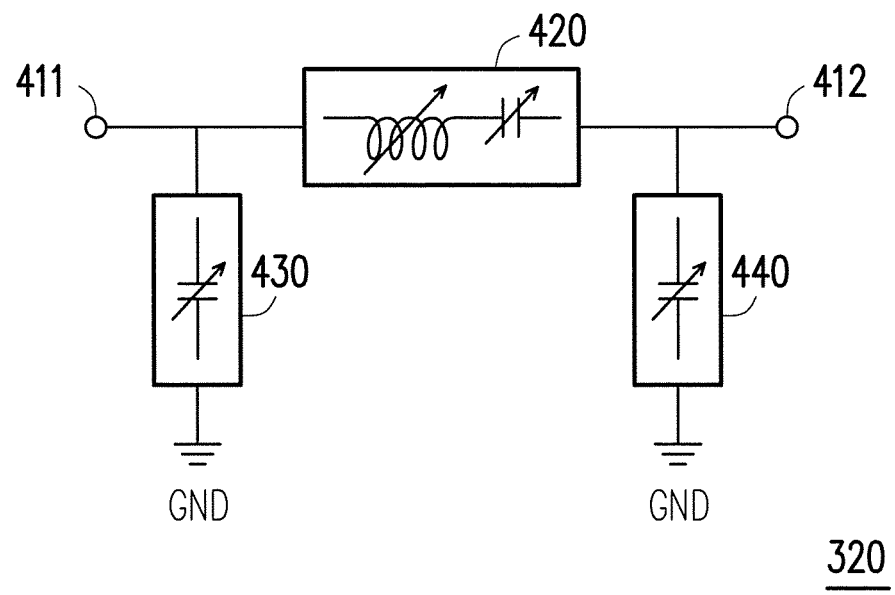

FIG. 4 is a schematic diagram of the tunable impedance matching circuit 320 according to an embodiment of the invention. The tunable impedance matching circuit 320 includes terminals 411 and 412, a series path 420, and shunt paths 430 and 440. The terminal 411 is coupled to the signal source 310, and the terminal 412 is coupled to the antenna 330. The series path 420 is coupled between the terminal 411 and the terminal 412 and includes a tunable capacitor and at least one tunable inductor. The shunt path 430 is coupled between the terminal 411 and a ground end GND, and the shunt path 440 is coupled between the terminal 412 and the ground end GND. Each of the shunt paths includes a tunable capacitor. The tunable impedance matching circuit 320 performs matching of the impedance of the antenna 330 by the aforementioned tunable inductor and tunable capacitors.

Figure 1:
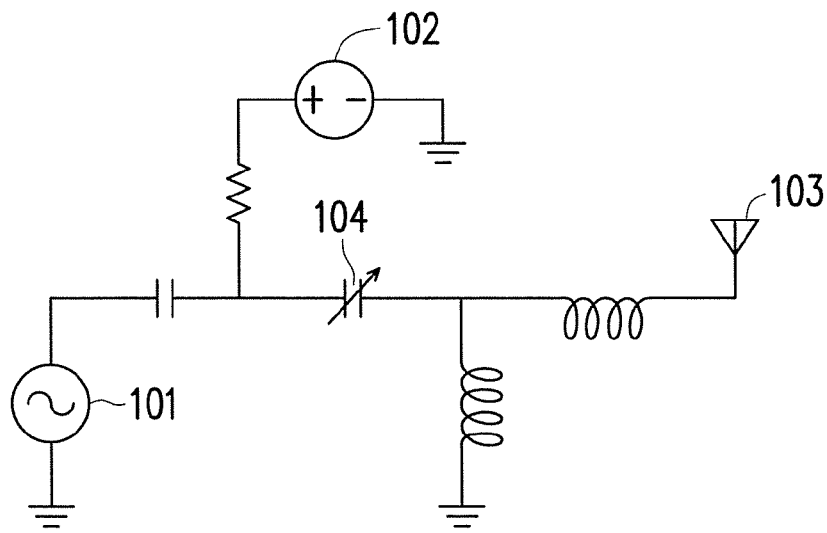
FIG. 1 and FIG. 2 are schematic diagrams of the conventional tunable impedance matching circuits.
Figure 2:
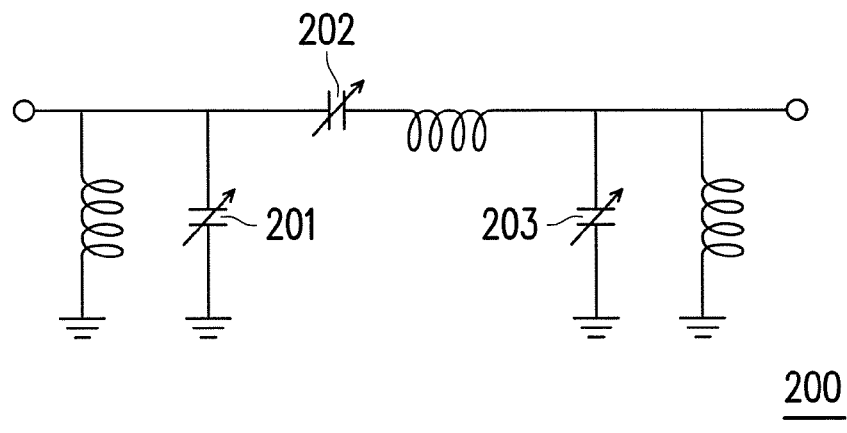
Figure 5:
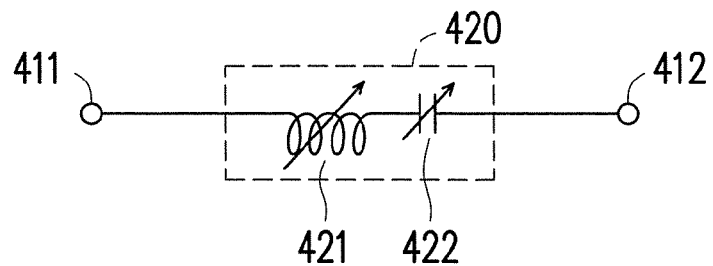
FIG. 5 and FIG. 6 are schematic diagrams illustrating a series path of a tunable impedance matching circuit according to a different embodiment of the invention.

FIG. 5 is a schematic diagram of the series path 420 according to an embodiment of the invention. As shown in FIG. 5, the series path 420 includes a tunable inductor 421 and a tunable capacitor 422 that are connected in series between the terminal 411 and the terminal 412. An impedance-tunable range of the tunable capacitor 422 may be smaller than an impedance-tunable range of the conventional tunable impedance matching circuit. For example, the impedance-tunable range of the tunable capacitor 202 of FIG. 2 is 1:10, and the impedance-tunable range of the tunable capacitor 422 is 1:3. Although the tunable capacitor 422 has smaller impedance-tunable range, an overall matching range of the tunable impedance matching circuit 320 compensated by the tunable inductor 421 is not inferior to a matching range of the tunable impedance matching circuit 200 of FIG. 2. Therefore, the tunable capacitor in the series path of this embodiment does not require a greater tunable range to improve the over-the-air performance of the antenna and can still maintain the overall matching range of the tunable impedance matching circuit.

Figure 6:
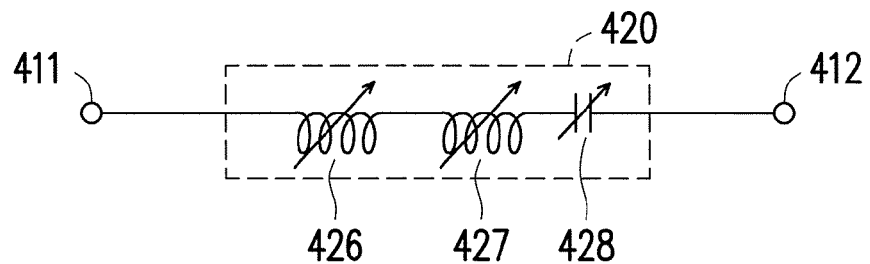

It is noted that the series path 420 of the invention may include more than one tunable inductor. In other embodiments of the invention, the series path 420 includes two or more tunable inductors. According to another embodiment of the invention, the series path 420, as shown in FIG. 6, includes tunable inductors 426 and 427, which are connected in series between the terminal 411 and the terminal 412, and a tunable capacitor 428. By disposing more tunable inductors, the tunable impedance matching circuit 320 can provide a wider matching range.

Figure 7:
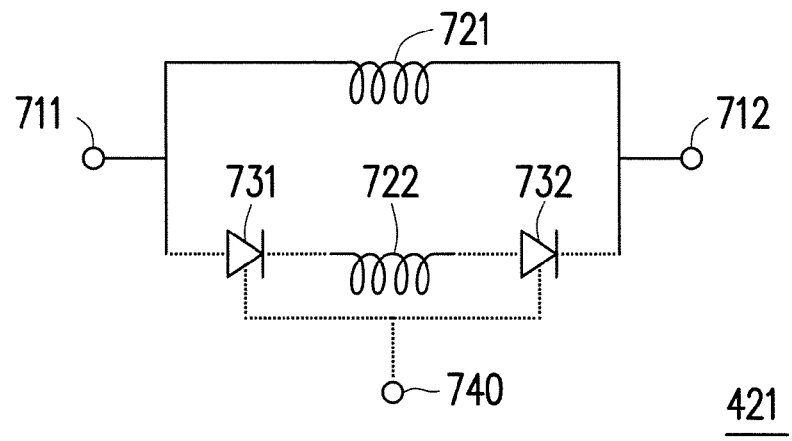
FIG. 7, FIG. 8, and FIG. 9 are schematic diagrams of a tunable inductor according to some embodiments of the invention.

FIG. 7 is a schematic diagram of the tunable inductor 421 according to an embodiment of the invention. Other tunable inductors, e.g. 426 and 427, may also be formed by adopting the same design. In the following paragraphs, the tunable inductor 421 is described in detail as an example. FIG. 7 is not a real circuit diagram and simply depicts the design principle of the tunable inductor 421. The tunable inductor 421 includes terminals 711 and 712, inductors 721 and 722, and diodes 731 and 732. The terminals 711 and 712 are used for connecting in series to the terminals 411 and 412 or the tunable capacitor or the rest of the tunable inductors in the series path 420. The inductor 721 is coupled between the terminals 711 and 712. The diode 731 is coupled between the terminal 711 and the inductor 722. The diode 732 is coupled between the terminal 712 and the inductor 722. The diodes 731 and 732 are turned on or off according to a control signal 740. When the diodes 731 and 732 are turned off, only the inductor 721 functions; and when the diodes 731 and 732 are turned on, the inductors 721 and 722 are connected in parallel, and thus an equivalent impedance of the tunable inductor 421 is reduced.

Figure 8:
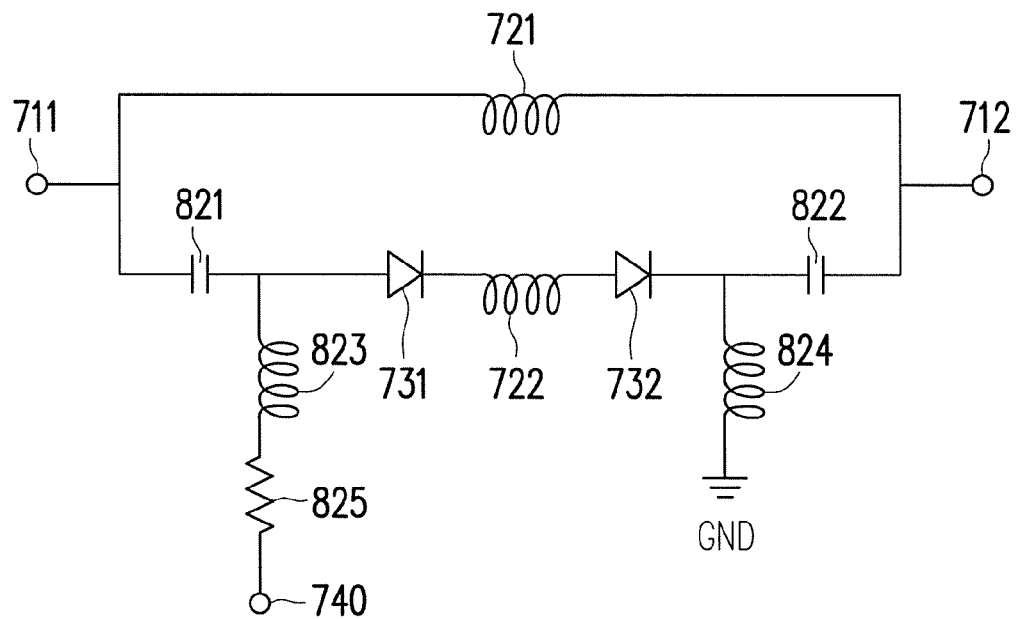

FIG. 8 is a schematic diagram of the tunable inductor 421 according to an embodiment of the invention. In this embodiment, the tunable inductor 421 further includes capacitors 821 and 822, inductors 823 and 824, and a resistor 825. A cathode of the diode 731 is coupled to the inductor 722; the capacitor 821 is coupled between the terminal 711 and an anode of the diode 731; an anode of the diode 732 is coupled to the inductor 722; and the capacitor 822 is coupled between a cathode of the diode 732 and the terminal 712. The inductor 823 is coupled to the capacitor 821 and the diode 731; and the resistor is coupled between the inductor 823 and the control signal 740. A terminal of the inductor 824 is coupled to the cathode of the diode 732 and the capacitor 822, and the other terminal thereof is coupled to the ground end GND.

The anode of the diode 731 receives the control signal 740 via the inductor 823 and the resistor 825. When the control signal 740 is at a preset low level, the diodes 731 and 732 are turned off, and an impedance of the inductor 721 is the equivalent impedance of the tunable inductor 421. When the control signal 740 is raised up to a preset high level, the diodes 731 and 732 are turned on so as to connect the inductors 721 and 722 in parallel, thereby reducing the equivalent impedance of the tunable inductor 421.

Figure 9:
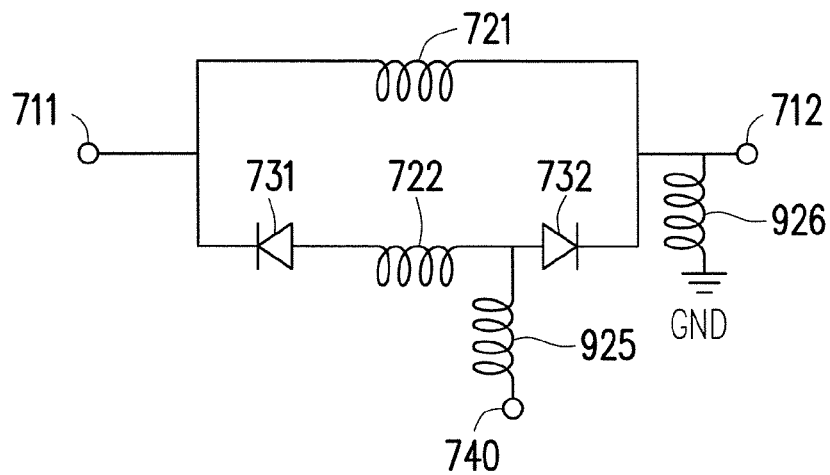

FIG. 9 is a schematic diagram of the tunable inductor 421 according to another embodiment of the invention. In this embodiment, the tunable inductor 421 further includes inductors 925 and 926. The cathode of the diode 731 is coupled to the terminal 711, and the anode of the diode 731 is coupled to the inductor 722. A terminal of the inductor 925 is coupled to the inductor 722 and the anode of the diode 732, and the other terminal thereof receives the control signal 740. A terminal of the inductor 926 is coupled to the inductor 721, the cathode of the diode 732, and the terminal 712, and the other terminal thereof is coupled to the ground end GND.

When the control signal 740 is at the preset low level, the diodes 731 and 732 are turned off, and an impedance of the inductor 721 is the equivalent impedance of the tunable inductor 421. When the control signal 740 is raised up to the preset high level, the diodes 731 and 732 are turned on so as to connect the inductors 721 and 722 in parallel, thereby reducing the equivalent impedance of the tunable inductor 421.

Figure 10:
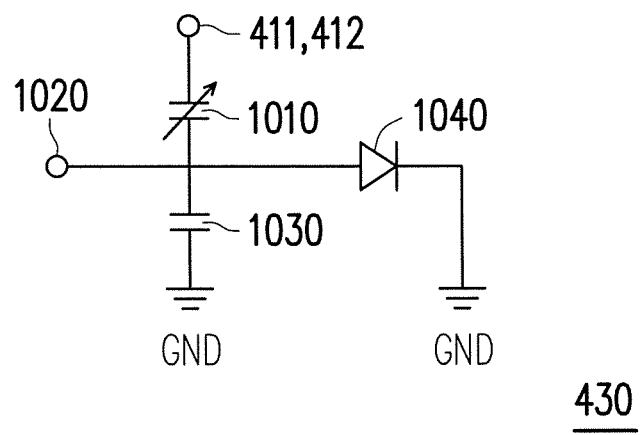
FIG. 10 is a schematic diagram illustrating a shunt path of a tunable impedance matching circuit according to an embodiment of the invention.

FIG. 10 is a schematic diagram illustrating a shunt path of the tunable impedance matching circuit 320 according to an embodiment of the invention. Shunt paths 430 and 440 of this embodiment have the same circuit. Thus, the shunt path 430 is taken as an example in the following paragraphs, and the description of the shunt path 440 shall be omitted.

The shunt path 430 includes a tunable capacitor 1010, a capacitor 1030, and a diode 1040. The tunable capacitor 1010 is coupled to the terminal 411. For the shunt path 440, the tunable capacitor 1010 is coupled to the terminal 412. The capacitor 1030 is coupled between the tunable capacitor 1010 and the ground end GND. An anode of the diode 1040 is coupled to the tunable capacitor 1010 and the capacitor 1030, and receives a control signal 1020. A cathode of the diode 1040 is coupled to the ground end GND.

Generally speaking, a lower-frequency signal requires greater capacitance, and a higher-frequency signal requires less capacitance. Therefore, when the signal source 310 sends a lower-frequency RF signal to the antenna 330, the control signal 1020 rises up to the preset high level to turn on the diode 1040, so as to disable the capacitor 1030. When the signal source 310 sends a higher-frequency RF signal to the antenna 330, the control signal 1020 is lowered to the preset low level to turn off the diode 1040, so as to connect the capacitor 1030 and the tunable capacitor 1010 in series, which is equivalent to a decrease of the capacitance of the tunable capacitor 1010. Because of the capacitor 1030, the tunable capacitor 1010 only requires a smaller impedance-tunable range, which does not impair the over-the-air performance of the antenna 330.

In conclusion of the above, the series path and the shunt path of the tunable impedance matching circuit of the invention both have wider tunable ranges, which achieve a greater matching range. The tunable impedance matching circuit of the invention is adapted for matching various antennas in different frequency bands, such that the mobile electronic devices, e.g. mobile phones, have the best output power to achieve the best over-the-air performance.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A tunable impedance matching circuit, comprising:
  a first terminal coupled to a signal source;
  a second terminal coupled to an antenna, wherein the tunable impedance matching circuit is adapted for matching the signal source with an impedance of the antenna;
  a series path coupled between the first terminal and the second terminal and comprising a first tunable capacitor and at least one tunable inductor; and
  a first shunt path coupled between the first terminal and a ground end and comprising a second tunable capacitor;
  a second shunt path coupled between the second terminal and the ground end and comprising a third tunable capacitor, wherein the second tunable capacitor is different from the third tunable capacitor, wherein one of the tunable inductors comprises:
    a third terminal connecting in series to the first terminal, the second terminal, the first tunable capacitor, or the rest of the tunable inductors;
    a fourth terminal connecting in series to the first terminal, the second terminal, the first tunable capacitor, or the rest of the tunable inductors;
    a first inductor coupled between the third terminal and the fourth terminal;
    a second inductor connecting in parallel to the first inductor;
    a first diode coupled between the third terminal and the second inductor; and
    a second diode coupled between the fourth terminal and the second inductor, wherein the first diode and the second diode are turned on or off according to a first control signal applied to the first diode and the second diode.

2. The tunable impedance matching circuit according to claim 1, wherein the first tunable capacitor and the at least one tunable inductor are connected in series between the first terminal and the second terminal.

3. The tunable impedance matching circuit according to claim 1, wherein an anode of the first diode is coupled to the third terminal and receives the first control signal, a cathode of the first diode is coupled to the second inductor; an anode of the second diode is coupled to the second inductor, and a cathode of the second diode is coupled to the fourth terminal and the ground end.

4. The tunable impedance matching circuit according to claim 3, wherein the tunable inductor further comprises:
  a first capacitor coupled between the third terminal and the anode of the first diode; and
  a second capacitor coupled between the cathode of the second diode and the fourth terminal.

5. The tunable impedance matching circuit according to claim 4, wherein the tunable inductor further comprises:
  a third inductor coupled to the first capacitor and the first diode;
  a resistor coupled between the third inductor and the first control signal; and
  a fourth inductor coupled between the second diode, the second capacitor, and the ground end.

6. The tunable impedance matching circuit according to claim 1, wherein the cathode of the first diode is coupled to the third terminal, the anode of the first diode is coupled to the second inductor; the anode of the second diode is coupled to the second inductor and receives the first control signal, and the cathode of the second diode is coupled to the fourth terminal.

7. The tunable impedance matching circuit according to claim 6, wherein the tunable inductor further comprises:
  a fifth inductor coupled between the second inductor, the second diode, and the first control signal; and
  a sixth inductor coupled between the first inductor, the second diode, the fourth terminal, and the ground end.

8. The tunable impedance matching circuit according to claim 1, wherein the second tunable capacitor is coupled to the first terminal or the second terminal, and each of the shunt paths further comprises:
  a third capacitor coupled between the second tunable capacitor and the ground end; and
  a third diode, an anode of the third diode being coupled to the second tunable capacitor and the third capacitor and receiving a second control signal, and a cathode of the third diode being coupled to the ground end.

9. The tunable impedance matching circuit according to claim 8, wherein when the signal source sends a first RF (radio frequency) signal to the antenna, the second control signal turns on the third diode; and when the signal source sends a second RF signal to the antenna, the second control signal turns off the third diode, wherein a frequency of the first RF signal is lower than a frequency of the second RF signal.

* * * * *